United States Patent [19]

Moskowitz et al.

[11] Patent Number: 5,528,222
[45] Date of Patent: Jun. 18, 1996

[54] RADIO FREQUENCY CIRCUIT AND MEMORY IN THIN FLEXIBLE PACKAGE

[75] Inventors: Paul A. Moskowitz, Yorktown Heights; Michael J. Brady, Brewster; Paul W. Coteus, Yorktown Heights, all of N.Y.

[73] Assignee: International Business Machines Corporation, Armonk, N.Y.

[21] Appl. No.: 303,977

[22] Filed: Sep. 9, 1994

[51] Int. Cl.[6] ............................................................ H04Q 1/02
[52] U.S. Cl. ........................... 340/572; 29/825; 29/829; 29/836; 340/825.3; 340/825.34; 340/825.54
[58] Field of Search ............................... 340/572, 825.34, 340/825.3, 825.54; 29/836, 829, 825

[56] References Cited

U.S. PATENT DOCUMENTS

| | | | |
|---|---|---|---|
| 3,934,122 | 1/1976 | Riccitelli | 340/825.34 |
| 4,009,375 | 2/1977 | White et al. | 364/436 |
| 4,674,175 | 6/1987 | Stampfli | 437/209 |
| 4,818,973 | 4/1989 | Yamakawa et al. | 340/572 |
| 4,857,893 | 8/1989 | Carroll | 340/572 |
| 5,014,040 | 5/1991 | Weaver et al. | 340/572 |
| 5,204,663 | 4/1993 | Lee | 340/825.3 |
| 5,257,011 | 10/1993 | Beigel | 340/572 |
| 5,396,218 | 3/1995 | Olah | 340/572 |

FOREIGN PATENT DOCUMENTS

| | | |
|---|---|---|
| 0481776 | 4/1992 | European Pat. Off. . |
| 0595549 | 5/1994 | European Pat. Off. . |
| 4319878 | 12/1993 | Germany . |
| 2173888 | 9/1990 | Japan . |
| 5266268 | 10/1993 | Japan . |
| 9309551 | 5/1993 | WIPO . |
| 9411846 | 5/1994 | WIPO . |

OTHER PUBLICATIONS

Patent Abstracts of Japan, vol. 13, No. 560 (M–906) 13 Dec. 1989 & JP, A, 01 234 296 (NEC Corp.) 19 Sep. 1989.
International Standard 7810, "Identification cards–Physical characteristics" First Edition–1985–12–15.
R. R. Tumalla et al, "Microelectronics Packaging Handbook", 1989, pp. 68, 76, 1154.

Primary Examiner—Glen Swann
Attorney, Agent, or Firm—Louis J. Percello

[57] ABSTRACT

A novel thin and flexible radio frequency (RF) tag has a semiconductor circuit with logic, memory, and a radio frequency circuits, connected to an antenna with all interconnections placed on a single plane of wiring without crossovers. The elements of the package (substrate, antenna, and laminated covers) are flexible. The elements of the package are all thin. The tag is thin and flexible, enabling a unique range of applications including: RF ID tagging of credit cards, passports, admission tickets, and postage stamps.

29 Claims, 10 Drawing Sheets

RADIO FREQUENCY CIRCUIT AND MEMORY IN THIN FLEXIBLE PACKAGE

FIELD OF THE INVENTION

This invention relates to a radio frequency circuit and memory in a thin flexible package. More specifically, the invention relates to a thin flexible radio frequency circuit used as a radio frequency tag.

BACKGROUND OF THE INVENTION

Radio Frequency Identification (RF ID) is just one of many identification technologies for identifying objects. The heart of the RF ID system lies in an information carrying tag. The tag functions in response to a coded RF signal received from a base station. Typically, the tag reflects the incident RF carrier back to the base station. Information is transferred as the reflected signal is modulated by the tag according to its programmed information protocol.

The tag consists of a semiconductor chip having RF circuits, logic, and memory. The tag also has an antenna, often a collection of discrete components, capacitors and diodes, for example, a battery in the case of active tags, a substrate for mounting the components, interconnections between components, and a means of physical enclosure. One variety of tag, passive tags, has no battery. They derive their energy from the RF signal used to interrogate the tag. In general, RF ID tags are manufactured by mounting the individual elements to a circuit card. This is done by using either short wire bond connections or soldered connections between the board and the circuit elements: chip, capacitors, diodes, antenna. The circuit card may be of epoxy-fiberglass composition or ceramic. The antennas are generally loops of wire soldered to the circuit card or consist of metal etched or plated on a circuit card. The whole assembly may be enclosed in a plastic box or molded into a three dimensional plastic package.

While the application of RF ID technology is not as widespread as other ID technologies, bar code for example, RF ID is on its way to becoming a pervasive technology in some areas, notably vehicle identification.

Growth in RF ID has been inhibited by the high cost of tags, the bulkiness of most of the tags, and problems of tag sensitivity and range. A typical tag costs in the $5 to $10 range.

Companies have focused on niche applications. Some prior art is used to identify railway boxcars. These tags tend to be quite large and are made of discrete components on circuit boards mounted in solid, non-flexible casings. RF tags are now used in the automatic toll industry, e.g. on thruway and bridge tolls. RF tags are being tested for uses as contactless fare cards for buses. Employee identification badges and security badges have been produced. Animal identification tags are also commercially available as are RF ID systems for tracking components in manufacturing processes.

Tags exist that have the-length and width of a standard credit card. However, these cards typically are over 2.5 mm thick and have a non-flexible casing. Tags also exist that have a credit card size length and width but with bumps where circuit is placed that causes them to be too thick to fit in card reader machinery While some electronic article surveillance (EAS), e.g. antitheft devices, are thin (0.3 mm) they typically contain limited amounts, (i.e., only one bit) of information. Some of these devices can be turned off once but cannot be reactivated.

FIG. 1A shows one prior art structure of a radio frequency tag 105. The tag 105 has a chip 110 mounted on a substrate 115. The chip 110 has contacts 120 that are connected to circuitry on the substrate 115 by wire bonds 125. An encapsulation material 130 covers the chip for environmental protection. The thickness of this tag 105 is determined by the combined thicknesses of the chip components. Typically, substrates in these tags are at least 10 mils, 0.25 mm, in thickness, the chip 110 along with the high loop 122 of the bond vary from 20 to 40 mils, 0.5 to 1 mm, in thickness and the encapsulation 130 is about 10 mils, 0.25 mm in thickness. As a result, tags 105 of this structure vary from a minimum of 40 to 60 mils, 1 to 1.5 mm, in thickness. This structure is too thick for many potential tag applications.

FIG. 1B shows another prior art structure 150 showing a chip 110 with the chip contacts 120 connected to circuitry contacts 155 with conducting adhesive 160. The substrate 165 of this structure 150 is typically made as a FR4/printed circuit (thickness 40 to 60 mils, 1 to 1.5 mm) or flexible substrate (10 mils,0.25 mm). The chip 110 and adhesive 160 add another 20 to 40 mils, 0.5 to 1 mm, to the thickness and the encapsulation 130 adds still another 10 to 20, 0.25 to 0.5 mm mils in structure 150 thickness. This structure therefore can vary in thickness from 80 to 130 mils, 2 to 3.5 mm, making it thicker than the structure in FIG. 1A.

Other thick structures are known in the art. These include quad flat pak (QFP) and/or small outline pak (SOP) as components. Structures made with these components are at least 1 mm thick and usually 2 to 3 mm thick.

PROBLEMS WITH THE PRIOR ART

Prior art teaches that there is a long felt need to manufacture thin RF ID tags on flexible substrates. However, while the goal of a thin flexible tag is desired, the prior art has failed to reach the goal. One prior art reference discloses a tag that is 1.5 to 2.0 mm thick. This tag thickness limits the applications of this tag. For example, it is far thicker than the International Organization for Standardization (ISO) standard credit card thickness of 0.76 mm and therefore could not be used in a credit card to be inserted into a credit card reader.

The prior art has failed to produce a thin tag because: care is not been taken to make each of the elements thin; elements are stacked one upon the next; and the antenna and connecting conductors require more than one plane of electrical wiring, ie. the designs use cross-overs for completing interconnections. As elements are stacked and layers are added the package grows thicker and flexibility is lost.

Another prior art reference discloses a package with a total thickness of 0.8 mm. This is still greater than the ISO standard credit card thickness of 0.76 mm. Furthermore, while thin elements are disclosed, no care is taken to use flexible materials throughout. The components are mounted on a hard circuit card and encapsulated in plastic. (Hard means can not be torn easily by hand.) The result a is rigid package. The prior art has not shown the use of thin flexible laminate covering materials for the packages. The results are that the packages are thick, and inflexible.

OBJECTS OF THE INVENTION

An object of this invention is an improved thin radio frequency tagging apparatus.

An object of the invention is a flexible radio frequency tag apparatus with a thin flexible protective lamination.

An object of the invention is a flexible radio frequency tag apparatus that may fit within the thickness limit of an ISO standard credit card, a passport cover, a postage stamp, an anti-theft device, or an admission ticket.

SUMMARY OF THE INVENTION

The present invention is a novel radio frequency (RF) tag that comprises a semiconductor circuit that has logic, memory, and radio frequency circuits. The semiconductor is mounted on a substrate and is capable of receiving a RF signal through an antenna that is electrically connected to the semiconductor through connections on the semiconductor. The present invention is a novel structure of a radio frequency tag design that is thin and flexible. The tag has the antenna and all interconnections placed on a single plane of wiring without crossovers. The elements of the package are placed adjacent to one another, i.e., they are not stacked. Elements of the package, the substrate, antenna, and laminated covers, are flexible. The elements are all thin such that the total package thickness including covers does not exceed that of an ISO standard credit card. The resulting tag package, comprised of thin, flexible components arranged and connected in a novel way, is also thin and flexible. Accordingly, this enables a novel range of applications that include: RF ID tagging of credit cards, passports, admission tickets, and postage stamps.

BRIEF DESCRIPTION OF THE DRAWINGS

FIG. 1, comprising

DETAILED DESCRIPTION OF THE INVENTION

Figure 1A:
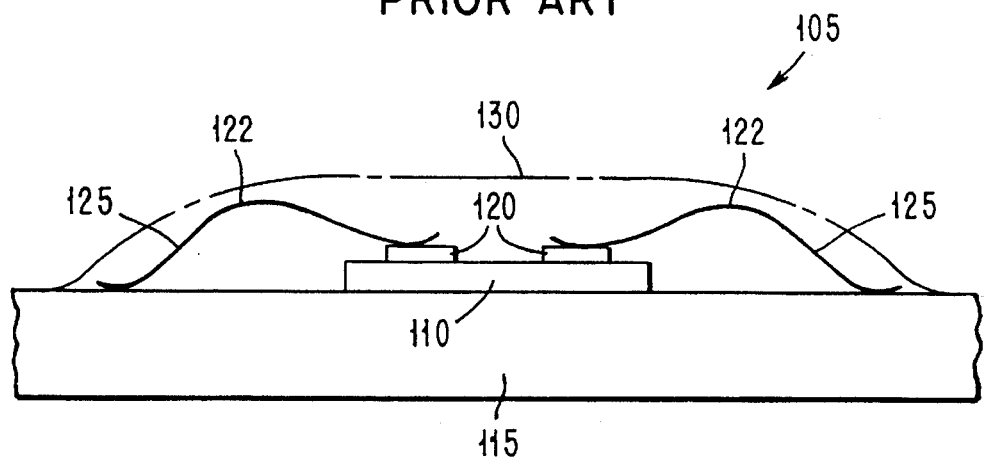
FIGS. 1A and 1B, is a drawing showing the cross section view of two typical embodiments in the prior art.
Figure 1B:
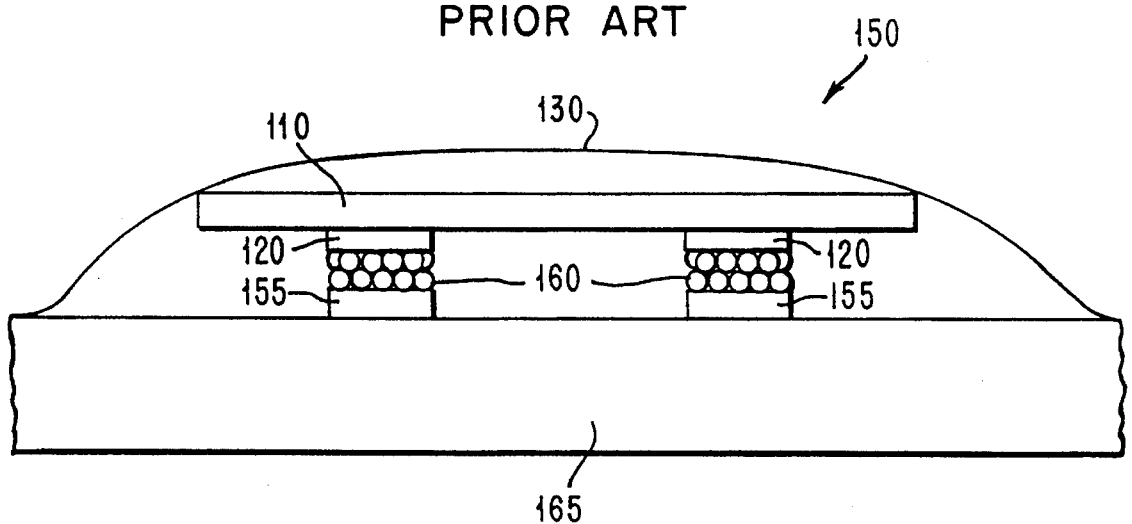
Figure 2:
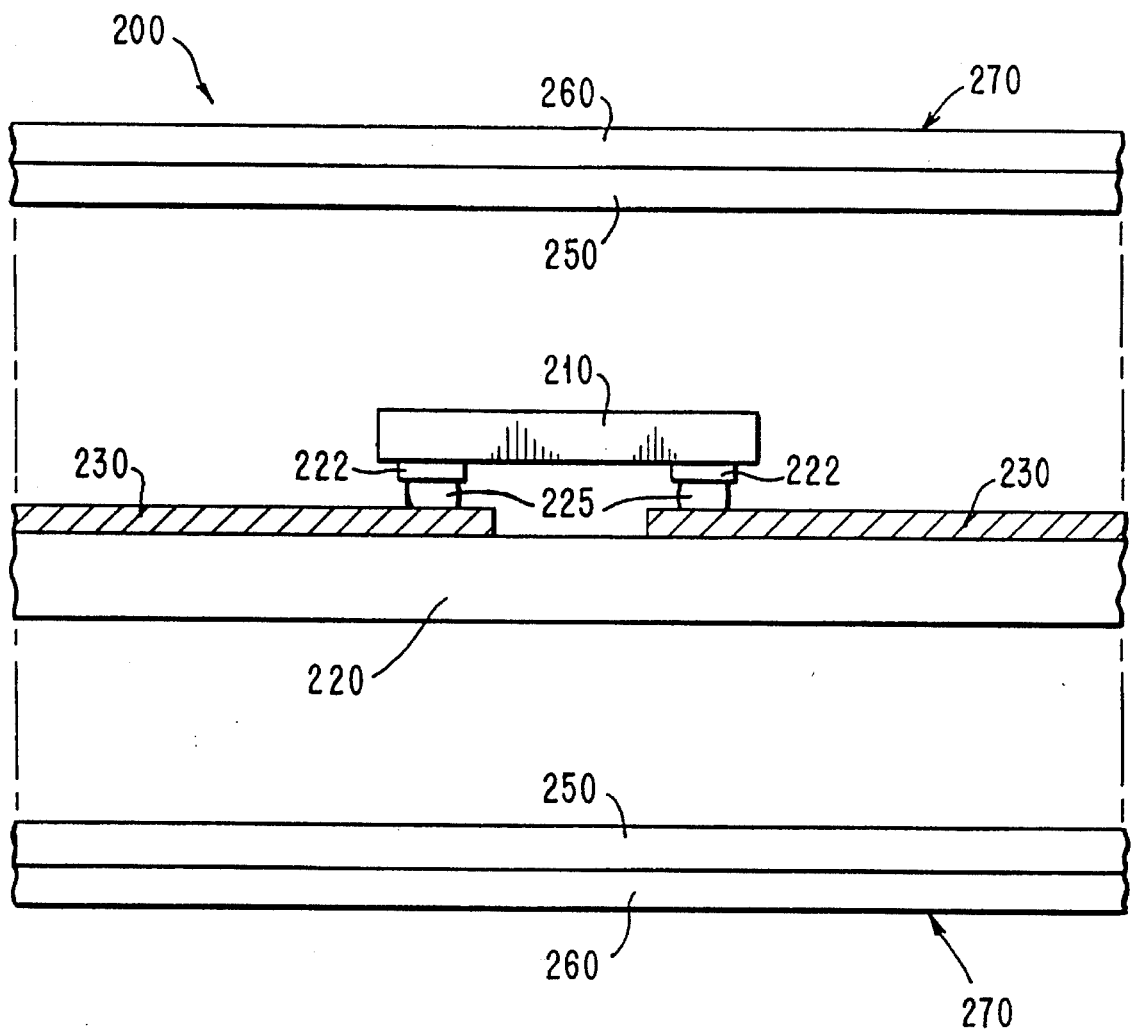
FIG. 2 is drawing showing a cross section of one preferred embodiment of the present thin RF ID tag.

FIG. 2 shows a side view of a novel RF ID tag 200. The chip 210 is located on a flexible substrate 220. The chip 210 with bumps 225 on contacts 222 is bonded to an antenna 230 contained on the substrate 220. The package is sealed by thin flexible laminations 270 consisting of a hot-melt adhesive 250 such as EVA on the inside and an outer coating 260 of a tough polymeric material on the outside.

The antenna is manufactured as an integral part of the substrate. It will consist of thin, typically 25 to 35 micron thick copper lines which have either been etched onto a copper/organic laminate or plated on the organic surface. The thinness of the copper maintains the flexibility of the substrate. Typical materials used are polyester or polyimide for the organic and electroplated or rolled annealed copper. The copper may be gold or tin plated to facilitate bonding. The chip is connected to the antenna lines by means of bumps on the chip, either plated gold bumps for thermocompression bonding or C4 solder bumps for solder bonding are preferred. The bumps 225 then become the connecting lines. Since they are only on the order of 25 microns or so they will not degrade electrical performance by introducing unwanted inductance into the circuit. The novel design has a single metal layer with no vias (between-plane connectors through a dielectric layer) in the flexible continuous film. By using only one level of metal to produce the antenna and interconnections, the package is kept thin. Further novelty of the invention includes arranging the components (chip and antenna and possibly a battery) in adjacent proximity to one another. This means that the components are close (i.e., not stacked). In a more preferred embodiment the closeness is insured because the chip 210 is bonded directly to the antenna 230 without the use of crossovers in the circuit. This is accomplished by using either a dipole, loop or folded dipole antenna that is resonant rather than using a multiloop antenna which requires cross-overs for connection. Thus all of the wiring is placed in a single plane. Keeping the antenna adjacent to the chip, avoiding cross-overs and stacking, also contributes to keeping the package thin.

To maintain the thinness of the package, the chill is made to be 225 to 375 microns thick by thinning. In general, semiconductors are manufactured on thick wafers, up to 1 mm thick. Thinning may be done by polishing or backgrinding of the wafer after manufacture. All elements and bonds are very thin. The elements are preferably: the chip (and battery if used) are 10 to 12 mils (250 to 300 microns) thick or thinner; the bonding structures are 2 mils (50 um) or less; laminating materials 2 to 4 mils (50 to 125 um) per side; to produce total thickness preferably of about 20 mils (500 um) or less but in any case less than 30 mils (750 um). Bonding mechanisms do not add to thickness of the tag as would techniques like wirebonding.

Although not required in one preferred embodiment, a unique flexible covering material 270 may be laminated upon one or both sides of the package. In another preferred embodiment, the material consists of two layers (250, 260). A soft copolymer such as ethyl-vinyl-acetate is located on the inside 250 surface of the cover. Tough polyester is located on the outside 260 surface. This combination provides environmental protection while maintaining the flexibility of the package. Typical thicknesses of the covers range from 50 to 125 microns. Alternately, a single layer of laminate such as polyethylene, polyester, mylar or polyimide may be used for covering.

Figure 3:
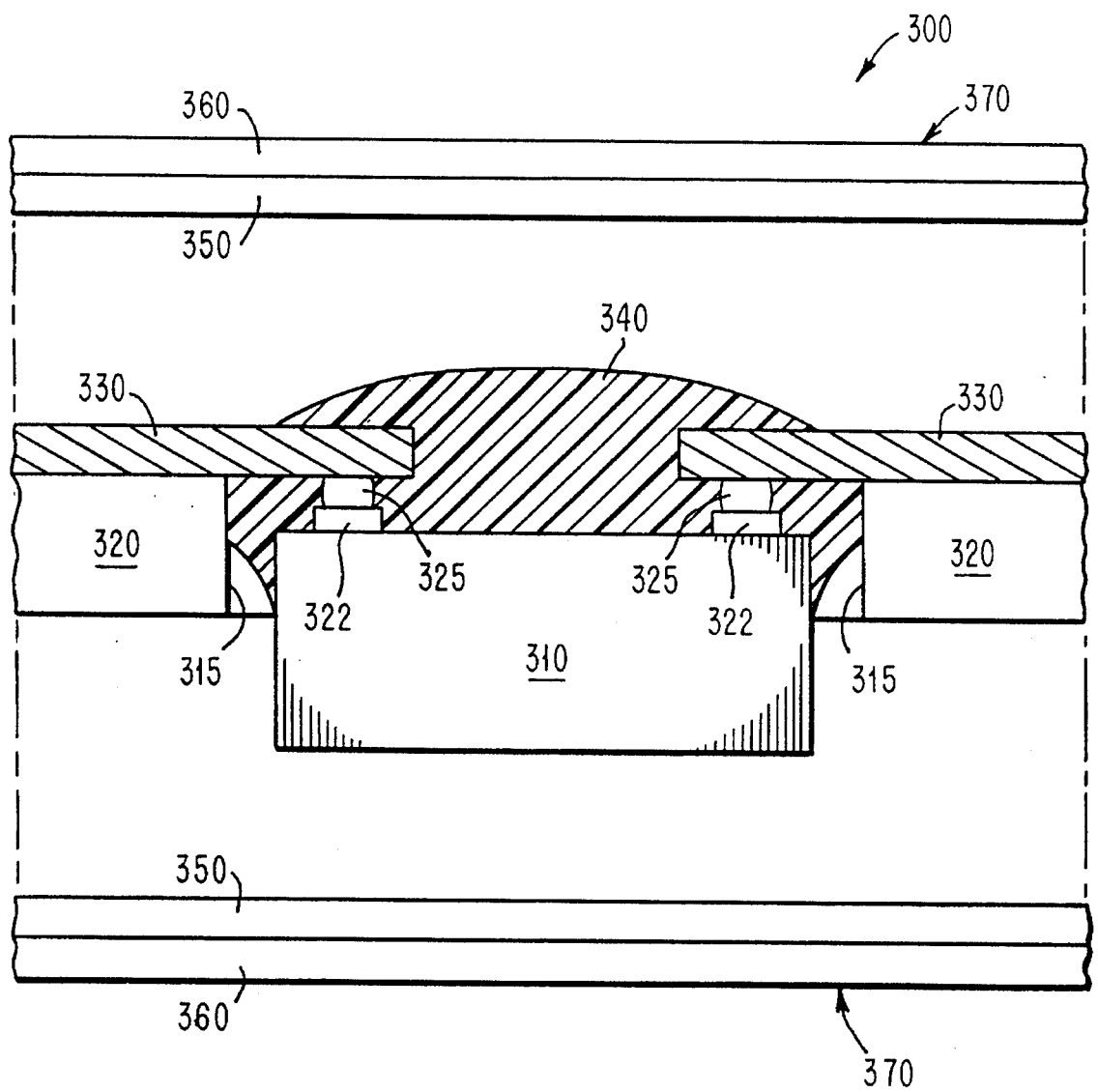
FIG. 3 is drawing showing a cross section of one preferred embodiment of the present thin RF ID tag with an aperture in the substrate.

FIG. 3 shows a side view of a unique RF ID tag 300. The chip 310 with contacts 322 and bumps 325 is bonded to antenna 330 thru window 315 in substrate 320. In a more preferred embodiment, encapsulant 340 is used to protect the chip 310, the bonds 325 on contacts 322, connected to antenna 330 located in window 315 between substrate 320 from environmental exposure. In a still more preferred embodiment, the package is sealed by thin flexible laminations 370 consisting of hot melt adhesive 350 such as EVA, phenolic butyral, or silicone adhesive on the inside and an outer coating 360 of a tough polymeric material (such as polyester, mylar, polyimide, and polyethylene) on the outside. In an alternative preferred embodiment, layer 370 comprises a single layer of organic material.

In order to further reduce the thickness of the package, the substrate is manufactured with a window allowing the insertion of the chip into the window. Thus, the thickness of the substrate is not added to the thickness of the chip. The window is produced in organic materials, polyimide or polyester by either etching or punching. In addition, the window may be used to allow the coating of the chip with a thin layer of encapsulation material. Hysol epoxy 4510 is one such material. The encapsulant does not add substantially to the total package thickness, adding perhaps 50 microns, but does provide additional environmental protection for the chip. Opaque materials in the encapsulant protect light sensitive circuits on the chip. In this embodiment, the antenna and the center of the chip can be coplanar.

Figure 4:
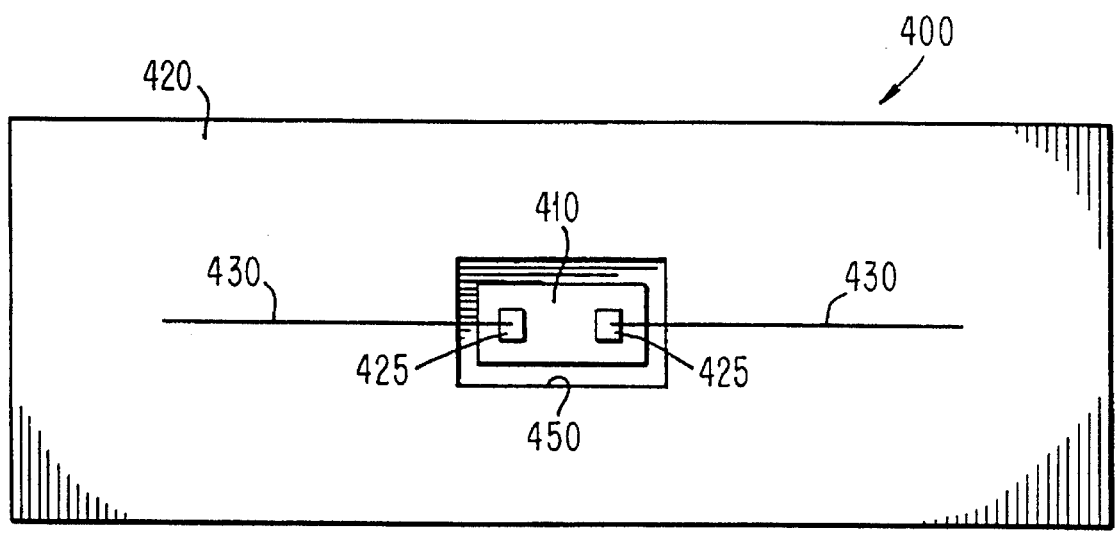
FIG. 4 is a top view of the thin tag showing a dipole antenna.

FIG. 4 shows a top view of the thin RF ID tag 400. The chip 410 is located within a window 450 placed in a flexible substrate 420. The chip 410 has contacts 425 which are connected to a antenna 430 contained on the substrate.

Figure 5:
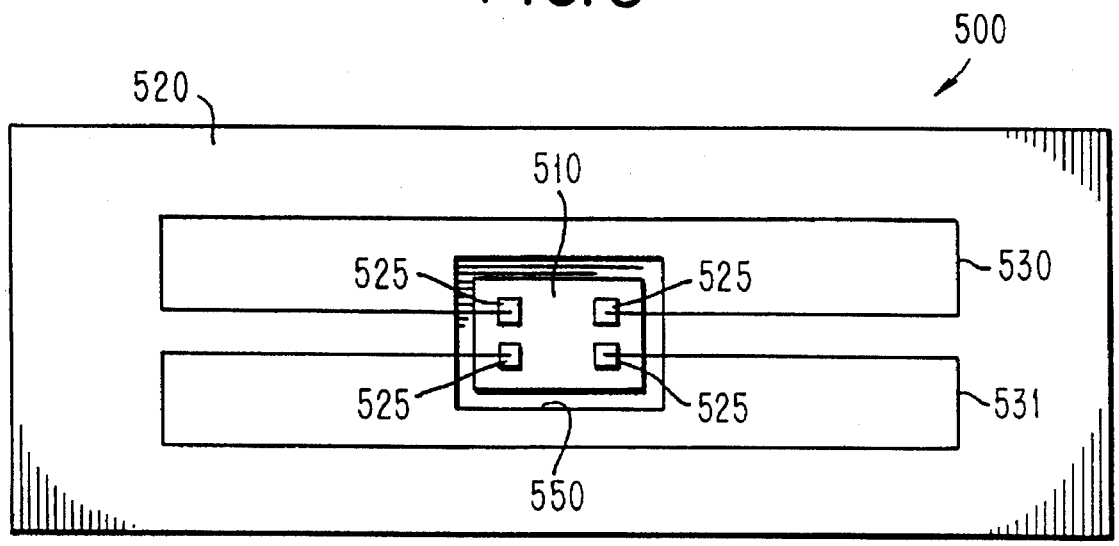
FIG. 5 is a top view of a thin tag having more than one folded dipole antennas.

FIG. 5 shows a top view of the thin RF ID tag 500. The chip 510 placed in the window 550 has contacts 525 which are connected to more than one folded dipole antenna 530 and 531 contained on the substrate.

Figure 6:
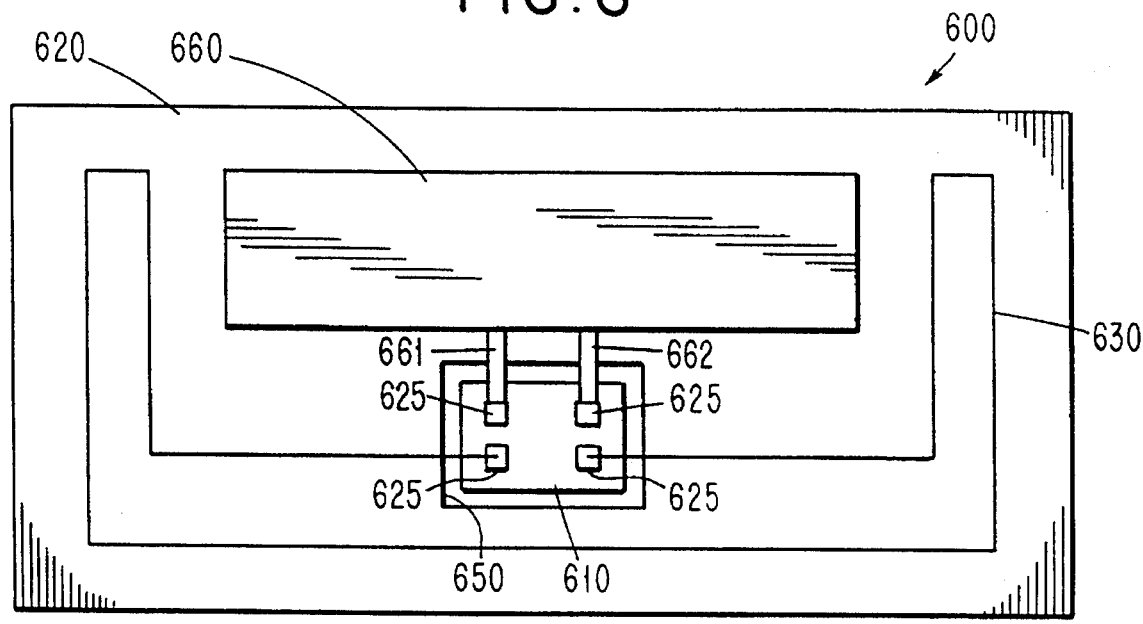
FIG. 6 is a top view of a thin tag having a battery included in the circuit.

FIG. 6 shows a top view of the thin tag 600. The semiconductor chip 610 is connected to a folded dipole antenna 630 by means of contacts 625. The antenna is contained in the substrate 620 as described above. A thin battery 660 is connected to the chip 610 by leads 661 and 662 bonded at contacts 625.

The battery has short connecting lines 661 and 662 providing electrical continuity between the battery and the chip. The battery is placed adjacent to the chip, not stacked upon the chip. The battery thickness of about 0.25 mm keeps the battery flexible. The antenna is designed such that it is also adjacent to the battery. There is no overlap. The wiring is kept in one plane and all of the elements (chip, battery, antenna) are coplanar; there is no stacking. As a result, the package is thin and flexible.

The bonding method for attaching batteries to prior art radio frequency tags include some of the techniques described below, i.e., soldering, conducting adhesive; and wire bonding. In addition, spot welding may be used. In spot welding, shown below in FIG. 7E, the battery connection pads are pressed to contacts on the substrate while a low-voltage high-current pulse bonds the two metals together.

In one preferred embodiment, the metallurgies on the battery, chip, and substrate are such that the battery attaching mechanism is consistent with the method and mechanism of the chip attachment. For example, use of tin plating on the substrate to enable chip bonding may preclude use of conductive adhesive to attach the battery but might allow use of gold plating to enable attaching of both.

A more preferred embodiment used to make a thin flexible rugged package uses robust chip attach techniques such as thermocompression (TC) bonding used in TAB (tape automated bonding) technology. Using TC bonding for the chip and spot welding for the battery is a novel combination of bonding techniques that enables attachment of the battery to a flexible substrate 620. In one preferred embodiment, the substrate is a TAB polyimide or polyester.

FIG. 7 shows different types of bonding available in the prior art to attach chips to circuitry that are on the substrate when producing an RF tag. These include thermocompression bonding, ultrasonic single point bonding, soldering, and conductive adhesive.

Figure 7A:
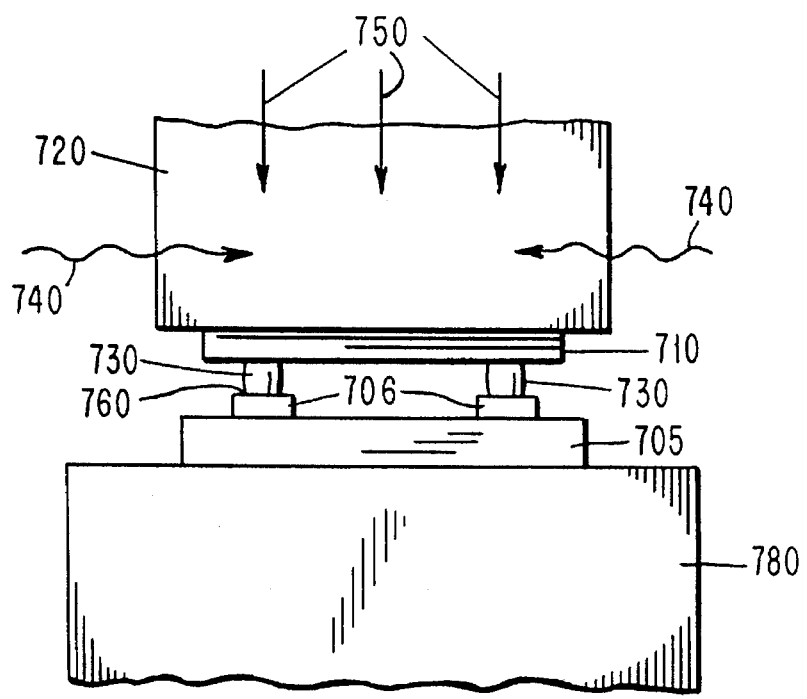
FIG. 7 comprises FIGS. 7A–7E which are cross sections of prior art chip bonds to substrates by means of thermocompression bonding (FIG. 7A), ultrasonic bonding (FIG. 7B), C4 solder bonding (FIG. 7C), conducting adhesive bonding (FIG. 7D), and spot welding (FIG. 7E).

In FIG. 7A, using thermocompression bonding, suitable metal surfaces are brought into contact with pressure 750 and heat 740 applied by thermode 720 to form a metal-to-metal bond 760 usually gold bumps 730 on chip 710 to gold-plated leads 706 on substrate 705 which rests on lower thermode 780. Many leads are bonded at once (gang bonding). This is used extensively for reel-to-reel TAB (tape automated bonding).

Figure 7B:
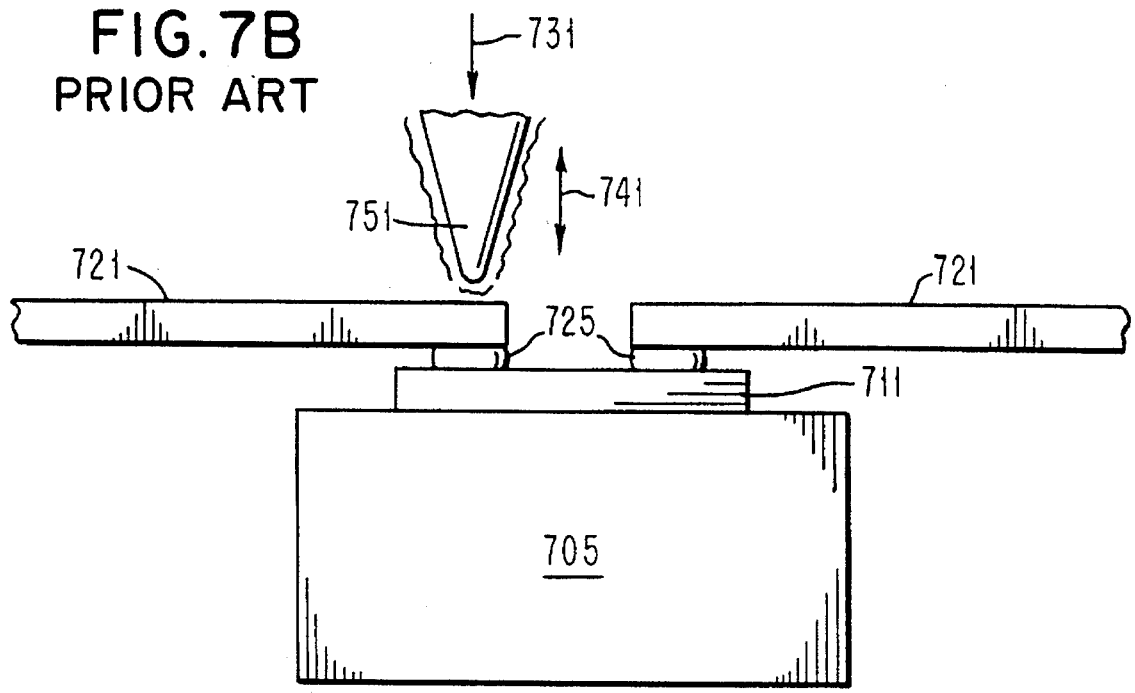

FIG. 7B shows ultrasonic singlepoint bonding a variation on thermocompression bonding for TAB where some ultrasonic energy is substituted for some pressure. One bond is done at a time. This bonding type also requires gold-to-gold metallurgy. Bonding tip 751 applies pressure 731 and ultrasonic energy 741 while pressing lead 721 to bump 725 on chip 711 resting on lower support 705.

Figure 7C:
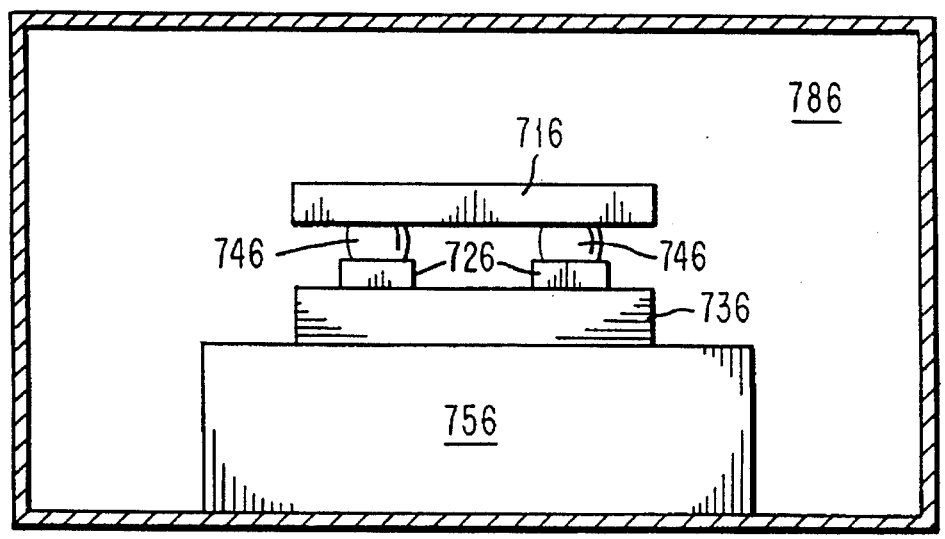

FIG. 7C shows soldering or C4 solderbonding where small lead/tin solder bumps 746 are used as the connecting medium between chip 716 and pads 726 on substrate 736. The reflow is carried out while the substrate is carried on platform 756 through oven 786. This usually requires the application of solder flux for reflow of the solder at elevated temperature.

Figure 7D:
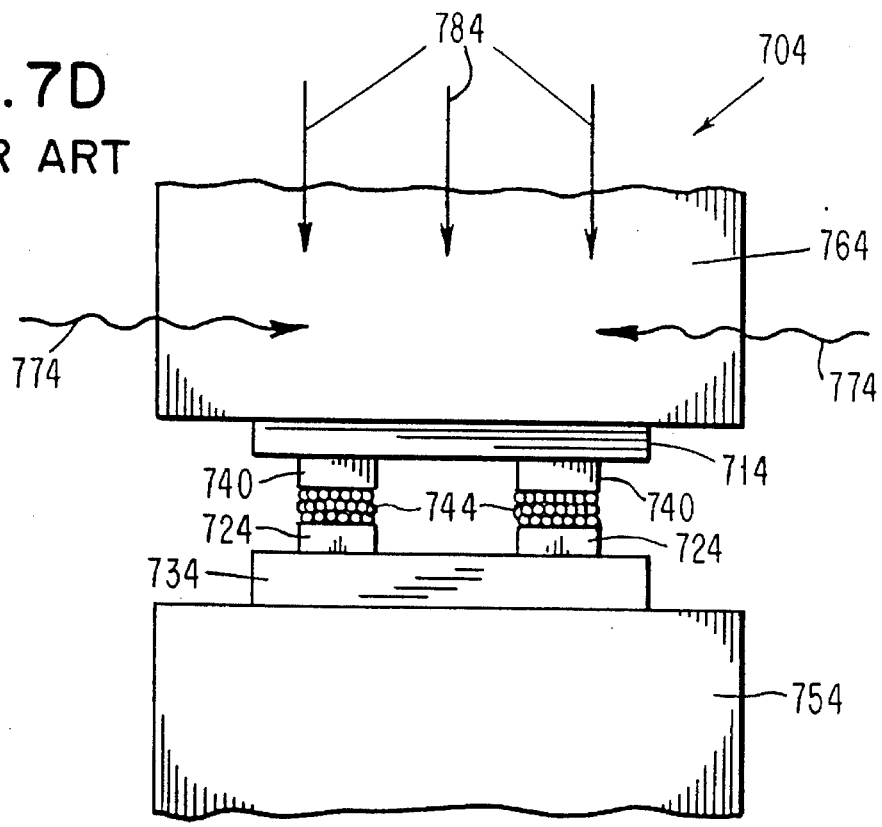

FIG. 7D shows conducting adhesive bonding where a metal-filled adhesive 744 is applied to form the connecting medium between chip pads 740 on chip 714 and the substrate pads 724 on the substrate 734. Heat 774 and pressure 784 are applied by pressing between thermodes 764 and 754.

Figure 7E:
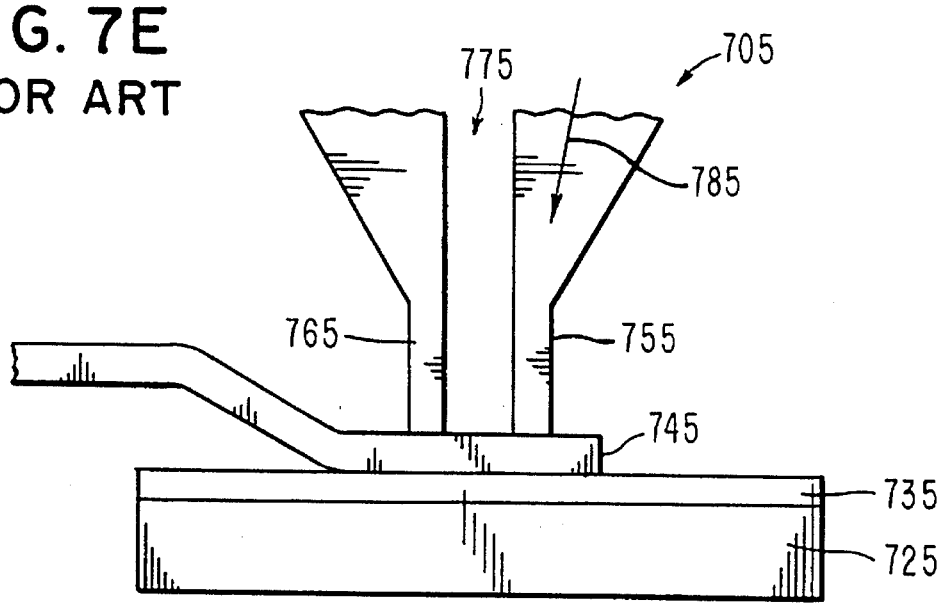

FIG. 7E shows spot welding where welding tips 755 and 765 separated by gap 775 are pressed to conductor 745 held in contact with conductor 735 placed on insulating substrate 725. Current 785 heats the welding tips 755 and 765 to make the bond.

Figure 8:
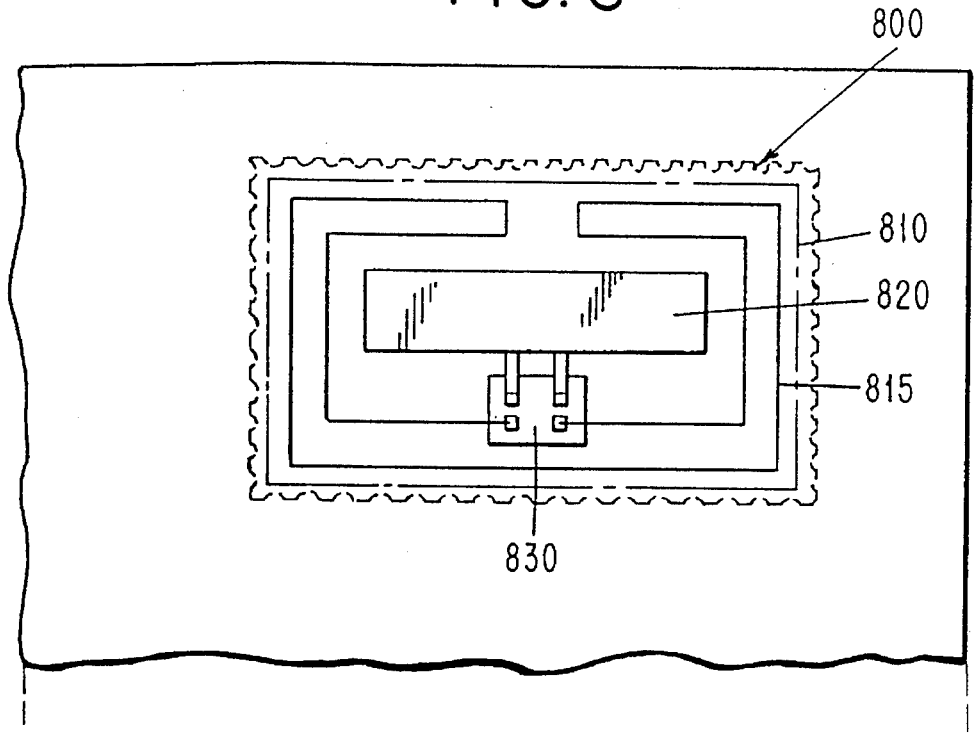
FIG. 8 shows a thin tag used as a postage stamp.
Figure 8A:
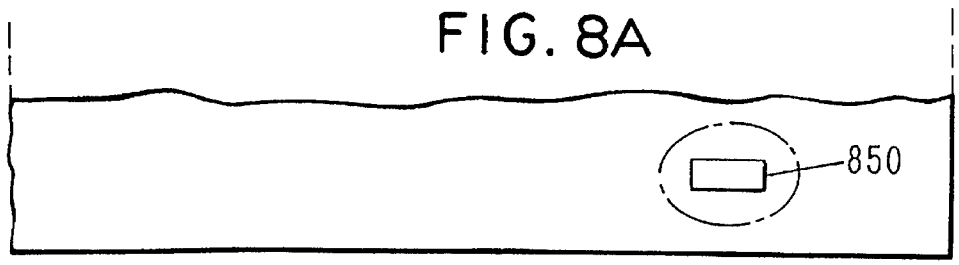
FIG. 8A shows a thin tag enclosed in a parcel membrane or in the wall of an envelope.

FIG. 8 shows an RF postage stamp 800 containing a thin RF tag 810 which consists of antenna 815, battery 820, and chip 830 affixed to envelope or package 840. This tag 810 can be any of the embodiments described above. In this application, the cover (typically 270 of FIG. 2 and 370 of FIG. 3) for the tag is the paper of the stamp. Adhesives, such as acrylics, are used to sandwich the tag between thin paper. These adhesives would correspond to the layer 250 in FIG. 2 and 350 in FIG. 3. The top surface (of one side 270, 370) can be printed with the appropriate graphics while the bottom surface has a pressure sensitive adhesive (of the other side 270, 370 in the case of a tag laminated on two sides), also acrylic, to bond the stamp to a package or letter envelope. The RF tag would contain information about mailing used to track a letter or parcel on which the stamp is placed. Alternatively, the RF tag 850 could be enclosed in the parcel membrane or in the wall of the envelop 840. In another, embodiment the RF tag could be placed within the parcel or envelop.

Figure 9:
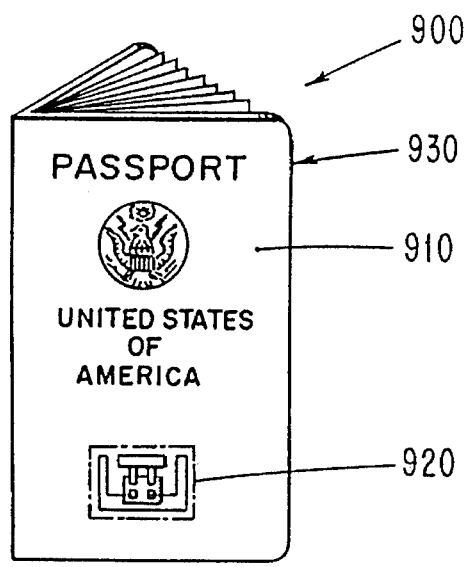
FIG. 9 shows a thin tag placed in the cover of a passport using a resonant loop antenna.

FIG. 9 shows the thin RF tag 920 embedded in the cover 910 of passport 930 to form an RF passport 900. Here the tag is sandwiched between the paper covers of the passport. The tag can have an environmental laminate(s) (270, 370) as described above or alternatively, the passport cover can be used as the tag laminate(s) (270, 370). The tag contains in its memory information on the identity of the passport owner, visas, dates of entry, restrictions, or any other desirable information. The information may be in encrypted form for added security. The encryption "key" would be a software code that is held and used solely by the agency issuing the passport. The deencryption key may be made public so that anyone (with a public deencryption key) can read information in the memory of the tag but only the agency having the encryption key can write information to the tag.

Figure 10:
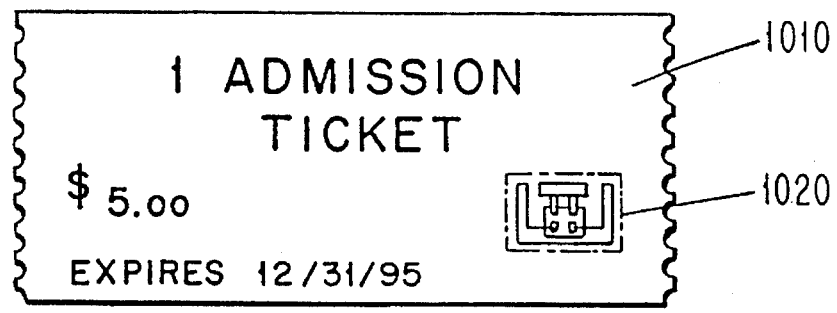
FIG. 10 shows a thin tag used on an admission ticket.

FIG. 10 shows admission ticket 1010 containing RF tag 1020. The tag is again enclosed between paper covers or other laminates. The ticket may be a simple admission ticket or entitlement such as an airline ticket or a food stamp. However, the tagged ticket may also serve as a tracking device.

Figure 11:
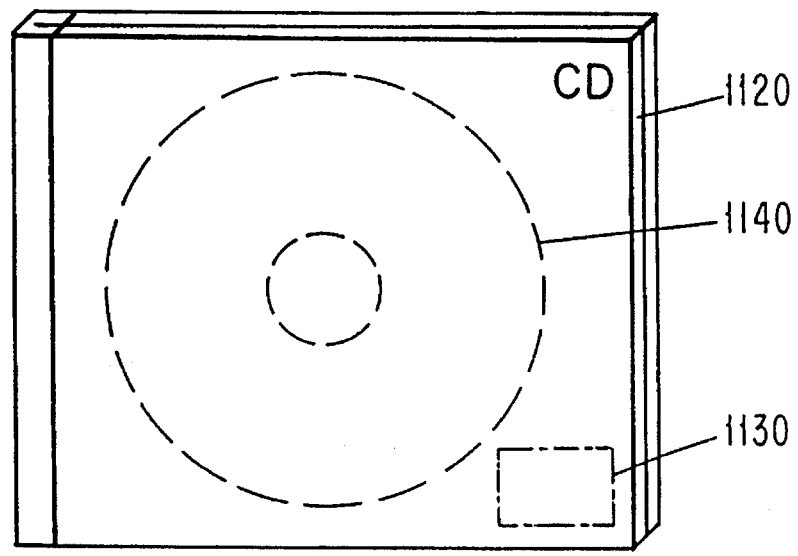
FIG. 11 shows a thin tag used as an antitheft device.

FIG. 11 shows a CD 1140 enclosed in box 1120 with an RF ID antitheft tag 1130 affixed to the box 1120. The tag serves as both a barcode replacement, inventory device, point of sale device, and as an antitheft device. Information on product variety, price, date of manufacture and sale may be carried by the tag. Additional bits of information in the memory of the circuit may be changed at the time of sale to indicated that the item may be taken from the store.

Figure 12:
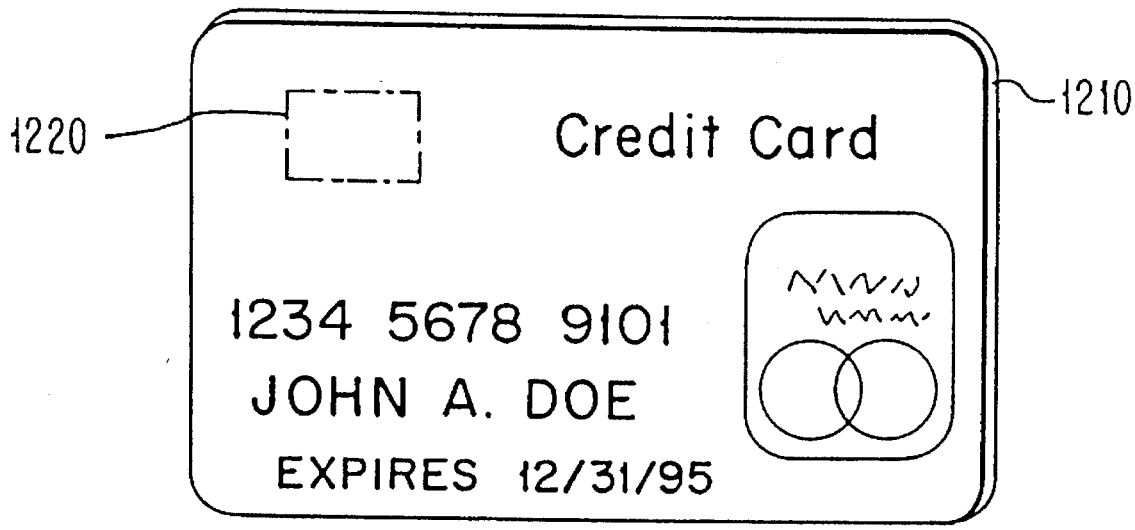
FIG. 12 shows a thin tag placed inside a credit card.

FIG. 12 shows ISO standard credit card 1210 containing an RF tag 1220. The credit card may serve as an ATM card, frequent flyer card, library card, phone card, employee ID, medical ID card, gasoline credit card or any credit or debit card. The covers (laminates 270, 370) of the tag could be the covers of the credit card, preferably PVC laminations. The core of the credit card, 0.5 mm thick, has a window placed in it at the time of manufacture. The 0.5 mm thick tag package is placed in the window and then sealed into the card. The resulting credit card, including the tag, will not only have the length and width that meet the ISO standard, but the thickness as well.

Figure 13:
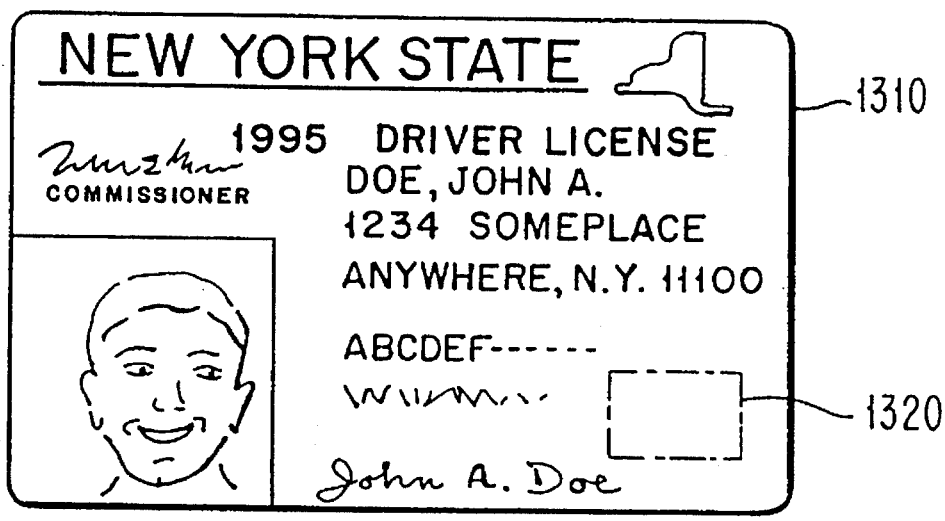
FIG. 13 shows a thin tag placed inside a license.

In another embodiment of the present invention, shown in FIG. 13, the RF tag 1320 is place within a vehicular drivers license 1310 in the same manner as described above. This allows information on the RF tag to be used for personal identification, driving record, organ donor information, restrictions, proof of identity and age, etc. The information can be encrypted for security purposes.

We claim:

1. A thin flexible electronic radio frequency tag circuit comprising;
   a. an insulating, flexible substrate;
   b. an antenna that is an integral part of the substrate and that has terminals;
   c. a circuit chip having a modulator circuit, a logic circuit, a memory circuit, and chip connectors and being on the substrate in adjacent proximity to the antenna;
   d. one or more connecting lines between the antenna terminals and the chip connectors, the connecting lines being coplanar with the antenna and antenna terminals.

2. A circuit, as in claim 1, wherein the substrate is organic.

3. A circuit, as in claim 2, wherein the substrate is polyimide.

4. A circuit, as in claim 2, wherein the substrate is polyester.

5. A circuit, as in claim 1, wherein the connecting lines are bonded to the chip connectors using any of the bonding types including thermal compression, single point bonding, C4 bonding, and conductive adhesive.

6. A circuit, as in claim 1, wherein the substrate has an aperture into which the chip is placed.

7. A circuit, as in claim 1, wherein the chip is covered by an encapsulant.

8. A circuit, as in claim 7, wherein the encapsulant is opaque.

9. A circuit, as in claim 7, wherein an organic cover surrounds the chip, the encapsulant, the substrate, and the antenna.

10. A circuit, as in claim 9, wherein the organic cover is one of the materials including polyester, mylar, polyimide, and polyethylene.

11. A circuit, as in claim 1, that is laminated by one or more layers.

12. A circuit, as in claim 11, that is laminated by a two layer laminate comprising a hard outer layer and a adhesive inner layer.

13. A circuit, as in claim 12, wherein the adhesive is one of the materials including ethyl vinyl acetate (EVA), phenolic butyral, and silicone adhesive.

14. A circuit, as in claim 11, wherein the circuit is laminated on one side.

15. A circuit, as in claim 11, wherein the circuit is laminated on two sides.

16. A circuit, as in claim 11, wherein the circuit has at least one tag dimension that is less than 760 microns (30 mils).

17. A circuit, as in claim 16, that is encapsulated as an International Organization for Standardization (ISO) standard credit card size package.

18. A circuit, as in claim 1, wherein the antenna is a resonant antenna and is any one of the following structures including folded dipole, dipole, and loop.

19. A circuit, as in claim 1, wherein a battery is also affixed to the substrate in adjacent proximity to the antenna and chip and is connected by one or more battery connecting lines to two or more chip battery contacts wherein the battery connecting lines and the battery contacts are coplanar with the antenna and connecting lines.

20. A circuit, as in claim 19, wherein the battery contacts are connected to the battery connecting lines by any of the bonding types including spot welding, soldering, thermocompression bonding, and conducting adhesive.

21. A circuit, as in claim 19, wherein the battery contacts are connected by spot welding and the chip contacts are connected to the antenna by thermocompression bonding.

22. A circuit, as in claim 1, wherein the chip has at least one chip dimension less than 300 microns (12 mils), the antenna has at least one antenna dimension less than 35 microns (1.4 mils), and the substrate has at least one substrate dimension less than 125 microns (5 mils) whereby the circuit has at least one circuit dimension less than 508 microns (20 mils).

23. A circuit, as in claim 22, wherein the chip memory has information about mailing and the circuit is applied to a mailed letter or parcel.

24. A circuit, as in claim 23, wherein the RF tag is enclosed within a stamp.

25. A circuit, as in claim 23, wherein the RF tag is enclosed within the parcel or envelop membrane.

26. A circuit, as in claim 22, wherein the tag is enclosed in a passport.

27. A circuit, as in claim 22, wherein the tag is enclosed in an admission ticket.

28. A circuit, as in claim 22, that is enclosed in an article and the tag has information to prevent theft.

29. A circuit, as in claim 22, wherein the tag is enclosed in a drivers license.

* * * * *